United States Patent
Shiga (10) Patent No.: US 7,800,136 B2
(45) Date of Patent: Sep. 21, 2010

(54) SEMICONDUCTOR INTEGRATED CIRCUIT AND SEMICONDUCTOR INTEGRATED CIRCUIT DESIGN METHOD

(75) Inventor: Hitoshi Shiga, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 485 days.

(21) Appl. No.: 11/858,556

(22) Filed: Sep. 20, 2007

(65) Prior Publication Data
US 2008/0073673 A1 Mar. 27, 2008

(30) Foreign Application Priority Data
Sep. 22, 2006 (JP) ............... 2006-257941

(51) Int. Cl.
*H01L 27/10* (2006.01)
(52) U.S. Cl. .................... 257/207; 257/211
(58) Field of Classification Search ......... 257/202–211, 257/758, E27.07
See application file for complete search history.

(56) References Cited

U.S. PATENT DOCUMENTS 6,166,560 A * 12/2000 Ogura et al. ............... 257/206

2003/0001171 A1 * 1/2003 Banno et al. ............... 257/207

FOREIGN PATENT DOCUMENTS

| JP | 5-347354 | 12/1993 |
|---|---|---|
| JP | 2000-22084 | 1/2000 |

* cited by examiner

*Primary Examiner*—Cuong Q Nguyen
(74) *Attorney, Agent, or Firm*—Oblon, Spivak, McClelland, Maier & Neustadt, L.L.P.

(57) ABSTRACT

The height H of several kinds of basic cell are made the same and several kinds of macro cell which have a length which is an integral multiplication of the height H of this basic cell, are prepared, the basic cell and macro cell are mixed and the circuit of a peripheral circuit is designed. A M0 wire of a first wiring layer which is formed on a semiconductor substrate is used as a wire used within a macro cell. The basic cell and the macro cell are connected by a M1 wire of a second wiring layer which is formed on the first wiring layer and a M2 wire M2 of a third wiring layer. The transistor layout of basic cells and macro cells is designed and verified in advance and stored in a cell library, and auto routing by a standard method may be carried out.

13 Claims, 12 Drawing Sheets

SEMICONDUCTOR INTEGRATED CIRCUIT AND SEMICONDUCTOR INTEGRATED CIRCUIT DESIGN METHOD

CROSS-REFERENCE TO RELATED APPLICATION

This application is based upon and claims the benefit of priority from the prior Japanese Patent Application No. 2006-257941, filed on Sep. 22, 2006, the entire contents of which are incorporated herein by reference.

BACKGROUND OF THE INVENTION

1. Field of the Invention

This invention relates to a semiconductor integrated circuit, in particular, a semiconductor integrated circuit which is designed by a standard cell method and its design method.

2. Description of the Related Art

A plurality of electronic elements, such as a transistor, are formed on a semiconductor substrate of a semiconductor integrated circuit. These electronic elements are connected to each other by a plurality of wires formed in wiring layers which are arranged on the semiconductor substrate. Here, because resistance values of each wiring layer are different, design rules have been established which have given consideration to each resistance values of each wiring layer.

For example, the resistance value of a first wiring layer (below referred to as "M0 layer") which is the nearest to the semiconductor substrate is high. As a result, the wires of the M0 layer are generally used to connect the electronic elements which are adjacent to each other. For example, they are used to connect an N type MOS transistor (below referred to as "NMOS") and P type transistor (below referred to as "PMOS") which form a CMOS. Alternatively, a second wiring layer (below referred to as "M1 layer") is formed on the M0 layer, and a third wiring layer (below referred to as "M2 layer") is formed on the second layer and has resistance value lower than that of M0 layer. Therefore, wires of the M2 layer are generally used to connect the electronic elements which are in a position separated from each other.

In this way, because there is need to consider a variety of design rules when designing a semiconductor integrated circuit, circuit design is becoming more complex with higher integration of semiconductor integrated circuits. Consequently, a design method called a standard cell method is used in order to shorten time needed for circuit design (for example, patent document 1, Japanese Laid-Open Patent Publication No. H5-347354). In the standard cell method, a transistor layout (cell) which is designed and verified in advance so that it has a specific logic function, is made to be a basic unit, wires for connecting between cells are arranged by using a calculating machine such as a computer.

A cell which is prepared as a basic unit in the standard cell method is called a basic cell. One basic cell has a simple logical function such as a NAND gate. Generally, as wires (internal wires) which connect a plurality of transistors within one basic cell so that the cell has a specific logical function, wires formed in the M0 layer are mainly used. Wires arranged in layers above the M0 layer may also be used in a basic cell when they are needed to avoid wires crossing. Alternatively, in order to connect a basic cell and another basic cell, wires arranged in layers above the M0 layer, specifically, the M1 and M2 layers, are used.

Meanwhile, a memory cell array including a plurality of memory cells which are arranged in a matrix and a peripheral circuit which is arranged on the periphery of this memory cell array are included in a semiconductor integrated circuit such as a semiconductor memory. In recent years, together with the progress of large capacity in semiconductor memories, there is a tendency for the space which is taken up by a memory cell array in a semiconductor integrated circuit to become larger and the region in which a peripheral circuit are arranged (below referred to as "peripheral circuit region") to become longer and narrower.

Here, wires of the M2 layer which has a low resistance are generally used in order to connect the electronic elements such as transistors which are separated from each other. As a result, wires of the M2 layer are arranged in a longitudinal direction in the long and narrow peripheral circuit region. As a result, if an attempt is made to make the region in which the memory cell array is placed larger, then the width of peripheral circuit region in which the wires formed in the M2 layer must be narrowed. Therefore, it becomes necessary to reduce the number of conductors which are placed in the M2 layer. Alternatively, if an attempt is made not to reduce the number of conductors which are placed in the M2 layer, then it is no longer possible to make the region for memory cell array larger and high integration become difficult.

In addition, because the basic cell is designed and verified in advance and registered in a cell library in the standard cell method, it is possible to automatically arrange wires (in other words, auto-routing) among the cells using a calculation machine. Alternatively, because a circuit which has a larger scale than the basic cell is not registered in the cell library, auto-routing is not available. Therefore, it is not easy to arrange wires among cells when basic cells are mixed with cells each of which has a larger scale than a basic cell, in particular, it is difficult to perform auto-routing by a calculation machine.

BRIEF SUMMARY OF THE INVENTION

In one embodiment of the present invention, a semiconductor integrated circuit comprising:

a semiconductor substrate formed with a plurality of transistors;

a first wiring layer formed on said semiconductor substrate;

a second wiring layer formed on said first wiring layer;

a third wiring layer formed on said second wiring layer;

a basic cell having a predetermined height and a function area, said function area including a first M0 wire formed in said first wiring layer for connecting a number of said plurality of transistors to have a specific logic function and a power supplying wire formed in a different wiring layer to said first wiring layer for supplying power to said transistors; and, a macro cell having a plurality of function areas and a height of an integral multiplication of the height of said basic cell, said macro cell including a second M0 wire formed in said first wiring layer, said second M0 wire interchanging with said power supplying wire and extending to another function area from one function area within said macro cell is provided.

In another embodiment of the present invention, a semiconductor integrated circuit comprising:

a semiconductor substrate formed with a plurality of transistors;

a first wiring layer formed on said semiconductor substrate;

a second wiring layer formed on said first wire layer;

a third wiring layer formed on said second wire layer;

first M0 wires formed in said first wiring layer for connecting a number of said plurality of transistors to have a specific logic function;

power supplying wires formed in a different wiring layer to said first wiring layer for supplying power to said transistors;

a plurality of function areas in which at least one of said first M0 wire, said power supplying wire, and a number of said plurality of transistors connected via said first M0 wire as an internal wire are arranged;

a second M0 wire formed in said first wiring layer for connecting a plurality of said function areas;

a basic cell having a predetermined height and one of a plurality of said function areas; and, a macro cell including a plurality of function areas which are connected by said second M0 wire, the height of said macro cell being an integral multiplication of the height of said basic cell is provided.

In further another embodiment of the present invention, a semiconductor integrated circuit design method comprising:

connecting a plurality of transistors which are formed in a semiconductor substrate by an M0 wire which is formed in a first wiring layer formed on said semiconductor substrate to form a basic cell having a specific logic function and a predetermined height;

registering the cell data of said basic cell in a cell library;

preparing a macro cell having the height of an integral multiplication of the height of said basic cell and a logic circuit larger than that of said basic cell;

connecting said transistors with said macro cell by an M0 wire formed in said first wiring layer;

wiring between said basic cell and said macro cell using said cell library in a state where said basic cell and said macro cell are congested, under a rule where said basic cell and said macro cell are connected by an M1 wire which is formed in a second wiring layer formed on said first wiring layer and an M2 wire which is formed in a third wiring layer formed on said second layer is provided.

DETAILED DESCRIPTION OF THE INVENTION

Below, the embodiments of the present invention will be explained while referring to the drawings. Below, an explanation of the same parts with the same symbols will be omitted or abbreviated. Further, the drawings are typical and the ratio of length, width and thickness etc may different to the actual parts.

Figure 1:
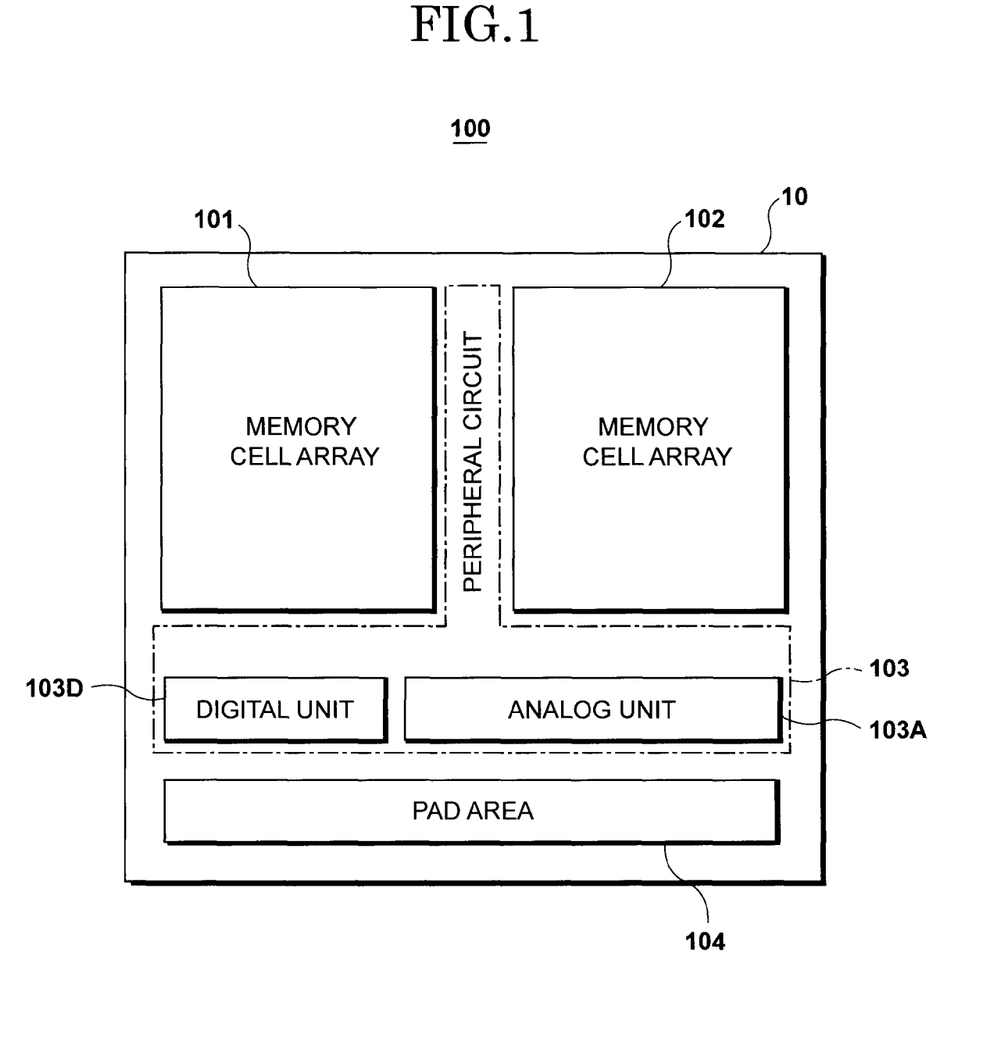
FIG. 1 is an outline drawing of a semiconductor integrated circuit relating to a first embodiment of this invention.

FIG. 1 is a diagram of a semiconductor integrated circuit 100 relating to a first embodiment of the present invention.

The semiconductor integrated circuit 100 is a semiconductor integrated circuit for a specific use with a NAND type flash memory mounted on a semiconductor substrate 10 as a non-volatile memory. This NAND type flash memory is suitable for large memory capacity and is arranged with memory cell arrays 101 and 102, a peripheral circuit 103 and a pad area 104.

Although not shown in the drawings, in the memory cell arrays 101 and 102, data lines and word lines are arranged and intersect with each other. A plurality of memory units are arranged in the direction of an extended data line and the direction of an extended word line to form a matrix shape. The memory unit is arranged with a memory string which includes a plurality of memory cells electrically connected in a series, a drain side selection transistor which is electrically connected in series to one end of this memory string and a source side selection transistor which is electrically connected in series to the other end of the memory string. A data line is electrically connected to the drain side selection transistor of the memory string and a source line is electrically connected to the source side selection transistor. A word line is electrically connected to each memory cell of the memory string. A memory cell is constructed from, for example, an IGFET (insulated gate type field effect transistor) having a charge accumulation region.

Figure 2:
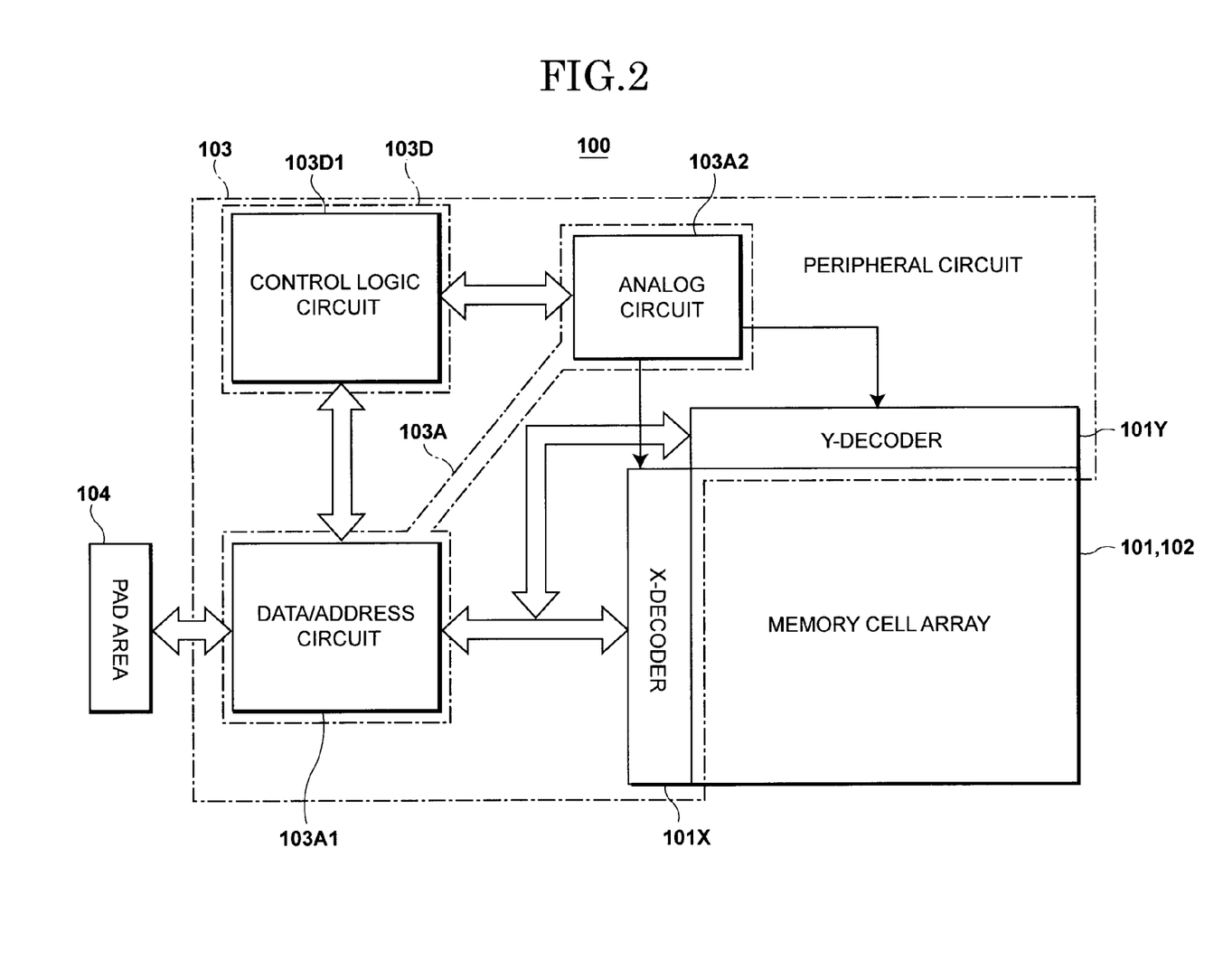
FIG. 2 is a block diagram showing a framework of the semiconductor integrated circuit.

FIG. 2 is a block diagram showing a framework of the semiconductor integrated circuit 100. As is shown in FIG. 2, an X decoder 101X and a Y decoder 101Y are each placed on the periphery of the memory cell arrays 101 and 102. Word lines which are extended to the memory cell arrays 101 and 102 are electrically connected to the X decoder 101X and one or more of the word lines is selected by the X decoder 101X. Data lines which are extended to the memory cell arrays 101 and 102 are electrically connected to the Y decoder 101Y and one or more of the data lines is selected by the Y decoder 101Y. The X decoder 101X and the Y decoder 101Y are both included in the peripheral circuit 103.

Further, as is shown in FIG. 1, the peripheral circuit 103 is arranged with an analog unit 103A and a digital unit 103D. As is shown in FIG. 2, the analog unit 103A includes a data/address circuit 103A1 and an analog circuit 103A2. The analog circuit 103A2 includes a charge pump and a regulator etc. As is shown in FIG. 2 the digital unit 103D includes a control logic circuit 103D1 in the first embodiment.

The function of the control logic circuit 103D can be changed according to the specifications of the NAND type flash memory. That is, in the manufacturing process of the control logic circuit 103D1 of the specific application semiconductor integrated circuit 100, a routing system of a standard cell method described below is used. In the routing system, a circuit design is performed in a state where basic cells having logic circuits and macro cells are mixed. The logic gate, such as a NAND gate circuit, an AND gate circuit or a NOR gate circuit constructs the control logic circuit 103D1.

It is possible to ascribe that one basic cell has one area (below referred to as "function area") in which a plurality of transistors are connected mainly via wires of a first wiring layer (M0 layer) so that the cell has a specific logical function. That is, in the present specification, a part which is formed in one function area which realizes a simple logical function such as a certain specific logic gate or a flip flop (these are sometimes generically named "basic circuit") is called a basic cell. Also, a part which is formed by combining a plurality of function areas so that a logic function more complex and large scale than a basic cell is realized is called a macro cell. The basic cell and the macro cell are logically designed and verified in advance. At least the cell data of various basic cells are registered in a cell library and it is possible to perform autorouting when designing a circuit by the standard cell method which is later described.

A macro cell can be considered as being constructed by combining a plurality of basic cells, however, the basic cells within the macro cell are designed in advance so that they are connected by the wires of the M0 layer. In order to distinguish between an area which corresponds to a basic cell within a macro cell and a basic cell outside a macro cell, an area in which a certain specific basic circuit is realized and which corresponds to one basic cell is called a function area. That is, a function area means an area in which a group of transistors are connected so that an intended specific basic circuit is realized. A few to tens of transistors are usually included in a function area. The transistors which comprise a certain specific basic circuit which are located within the same function area are connected mainly via the wires of the M1(first M0 wire).

As a specific example of a basic cell, a cell which realizes a logic gate such as a NOT gate (inverter), an AND gate, a NAND gate, an OR gate, a NOR gate and an XOR gate as well as a flip flop, a counter, a shift register, a decoder, a multiplexer and an adding circuit, is given. A macro cell is formed by combining the areas each of which corresponds to a basic cell and is an area in which a circuit which is repeatedly used in the peripheral circuit area is formed.

Figure 3:
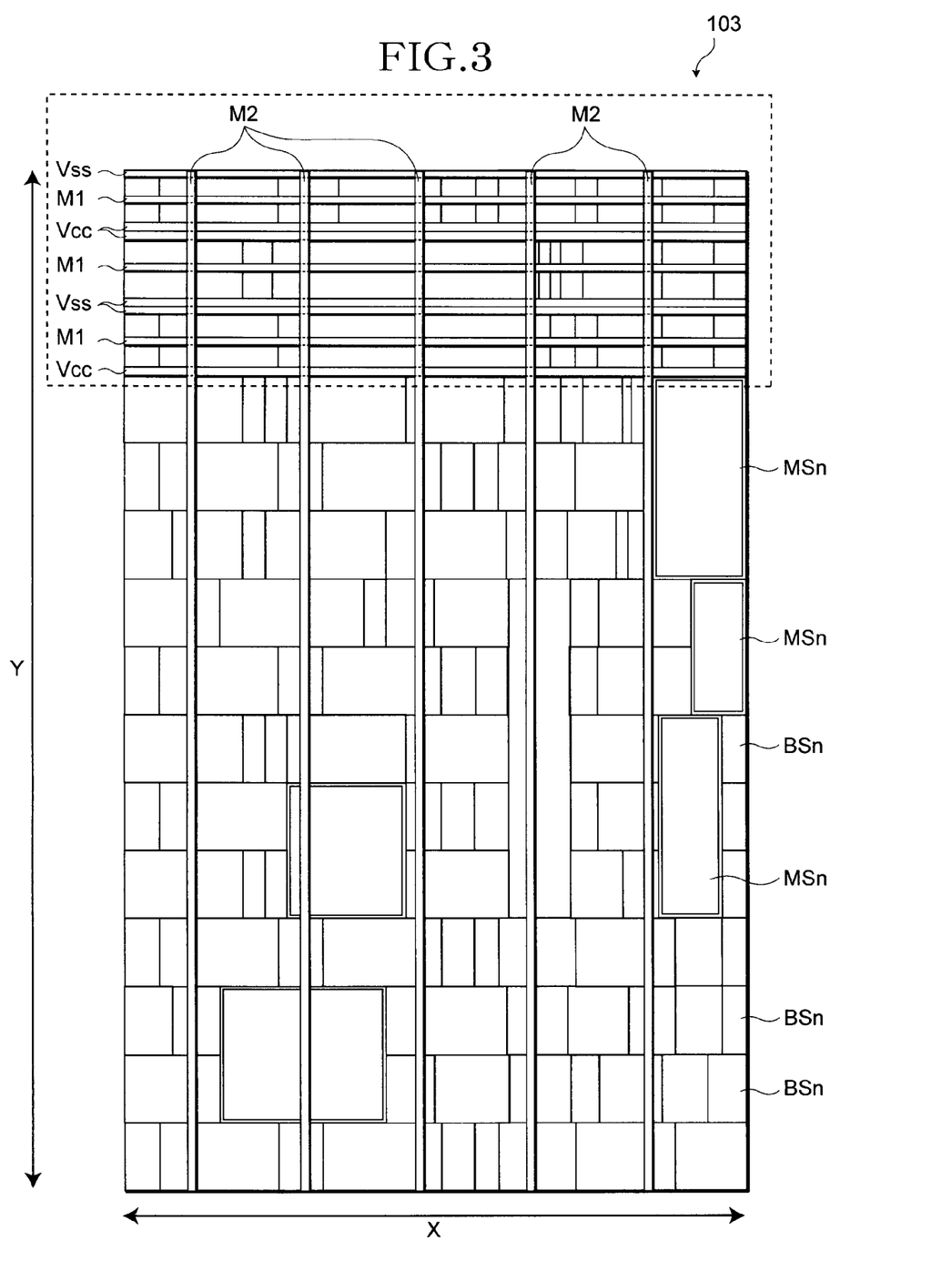
FIG. 3 is an enlarged plane view of a peripheral area shown in FIG. 2.

FIG. 3 is a diagram which shows a cell placement in the digital unit 103D and a wire arrangement of M1 wires of a second wiring layer and M2 wires of a third wiring layer. As is shown in FIG. 3, according to the present embodiment, basic cells BSn and macro cells MSn are mixed and placed in a peripheral circuit which is placed in the periphery of a memory cell array.

Figure 4A:
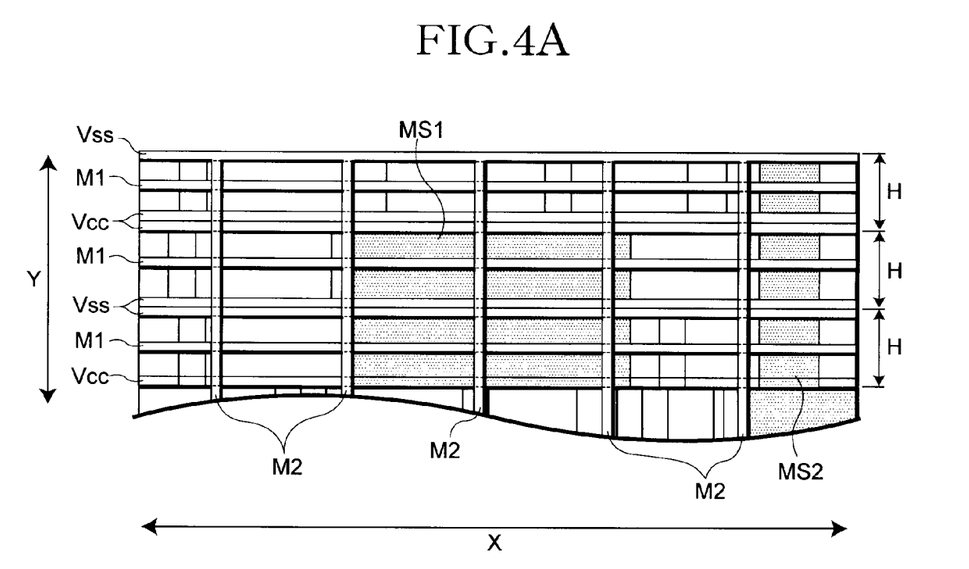
FIG. 4A is an enlarged plane view of a part which is surrounded by a dotted line in FIG. 3.
Figure 4B:
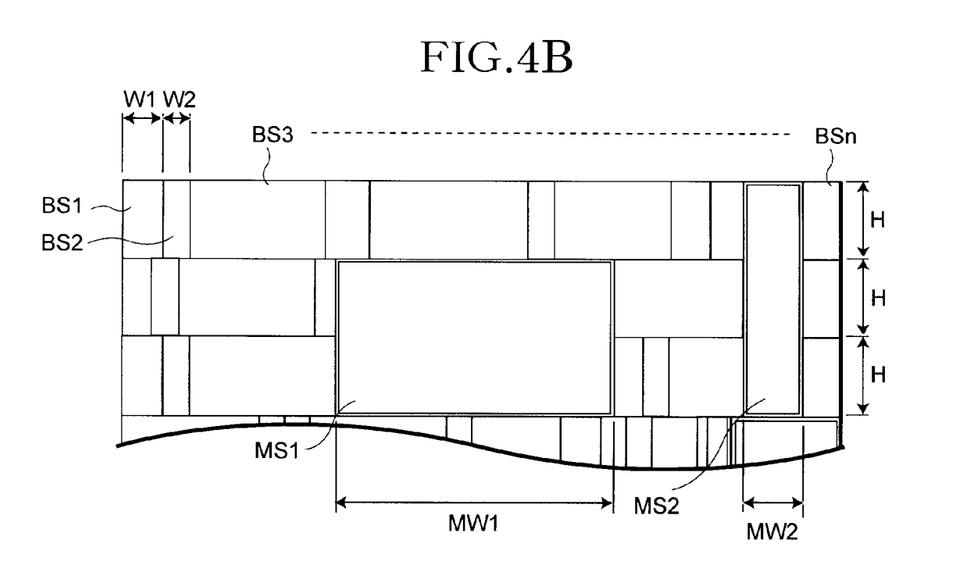
FIG. 4B is a plane vies which shows a placement of the cells in the area which is shown in FIG. 4A.

Further, in FIG. 3, only some of the M1 wires and M2 wires are shown. Also in the figure, one basic cell is shown by one frame which is surrounded by single line and one macro cell is shown by one frame which is surrounded by double line. FIG. 4A is an enlarged diagram of a part which is surrounded by a dotted line in FIG. 3 and FIG. 4B is a pattern diagram which shows a placement of the cells in the area which is shown in FIG. 4A.

Figure 5:
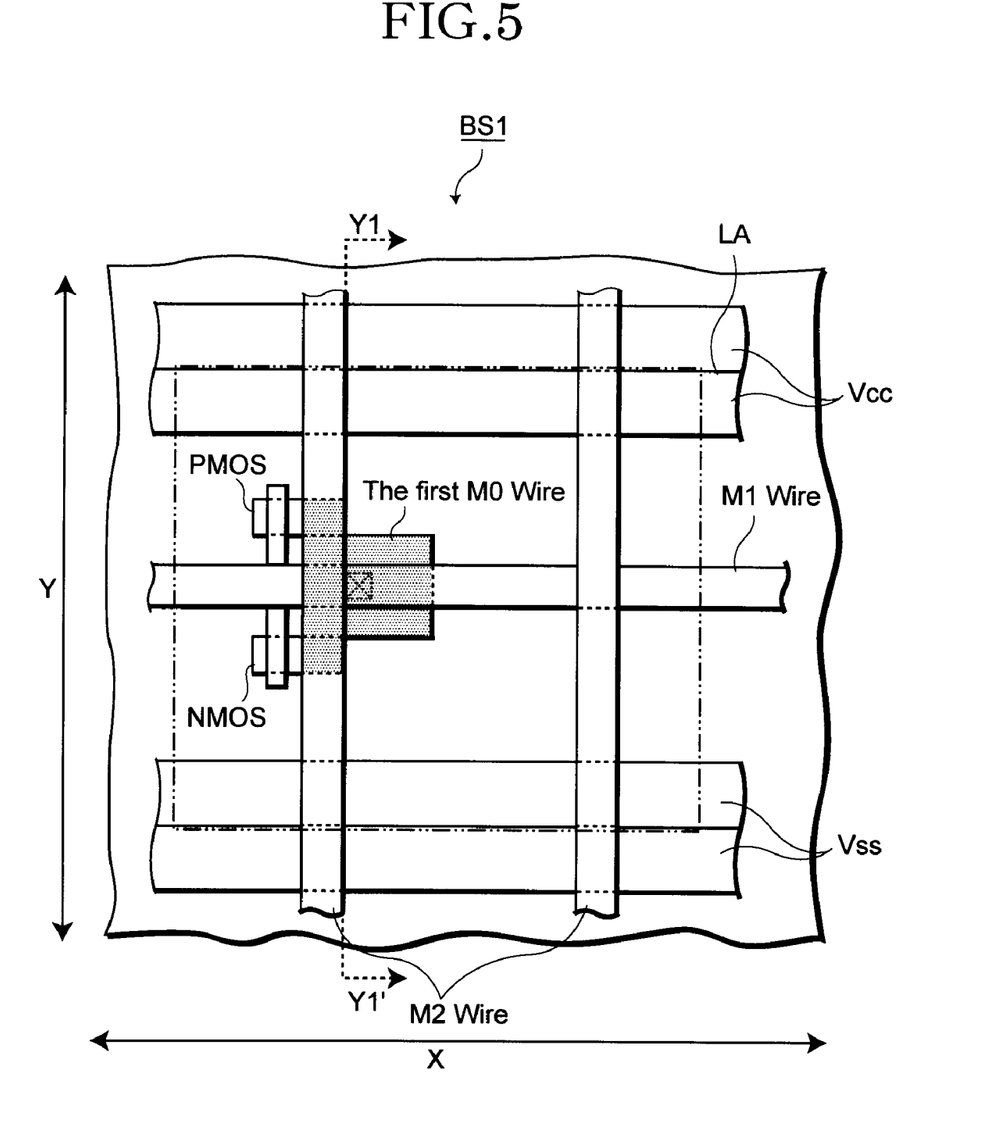
FIG. 5 is a plane view of a basic cell included in the peripheral area.
Figure 6:
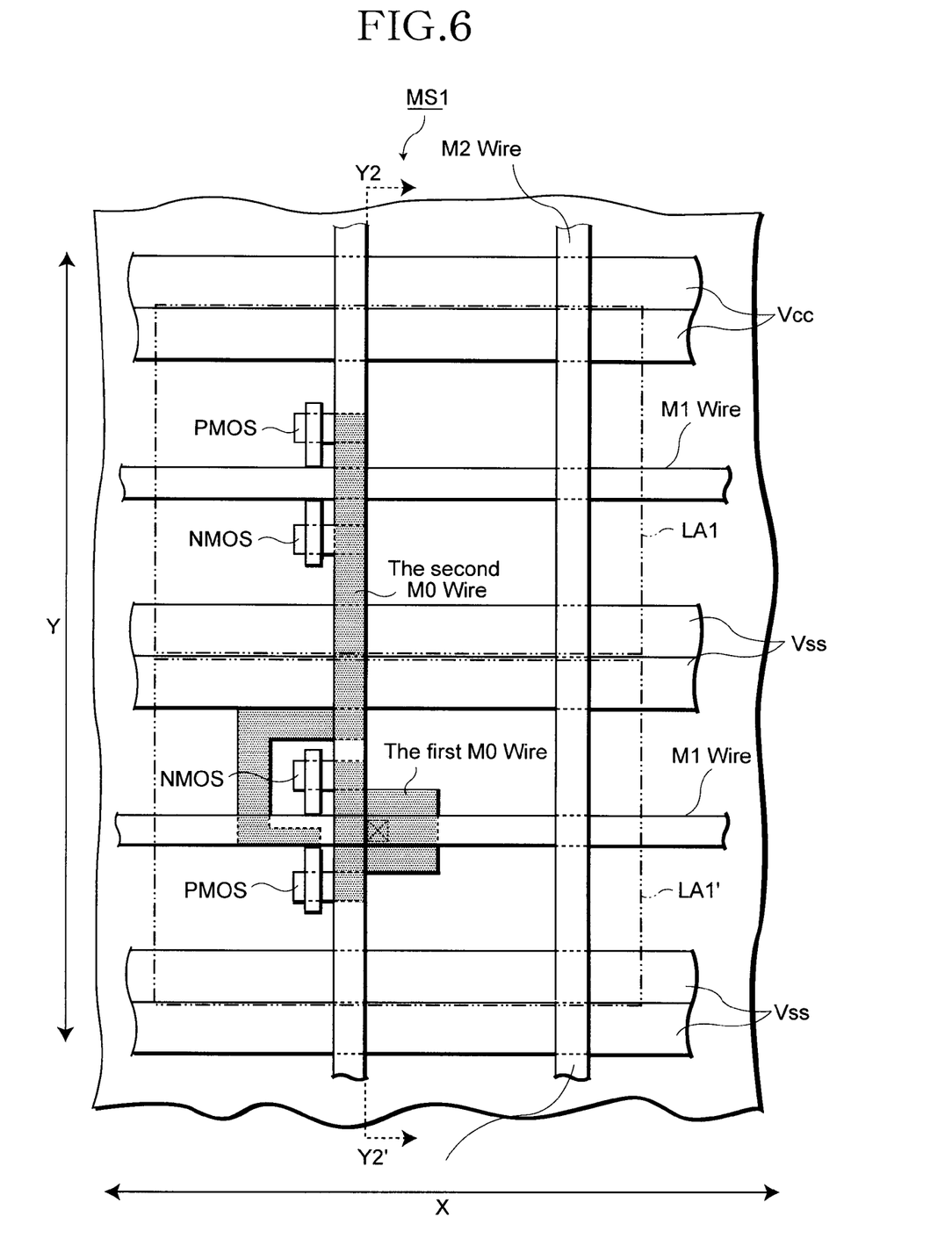
FIG. 6 is a plane view of a macro cell included in the peripheral area.
Figure 7:
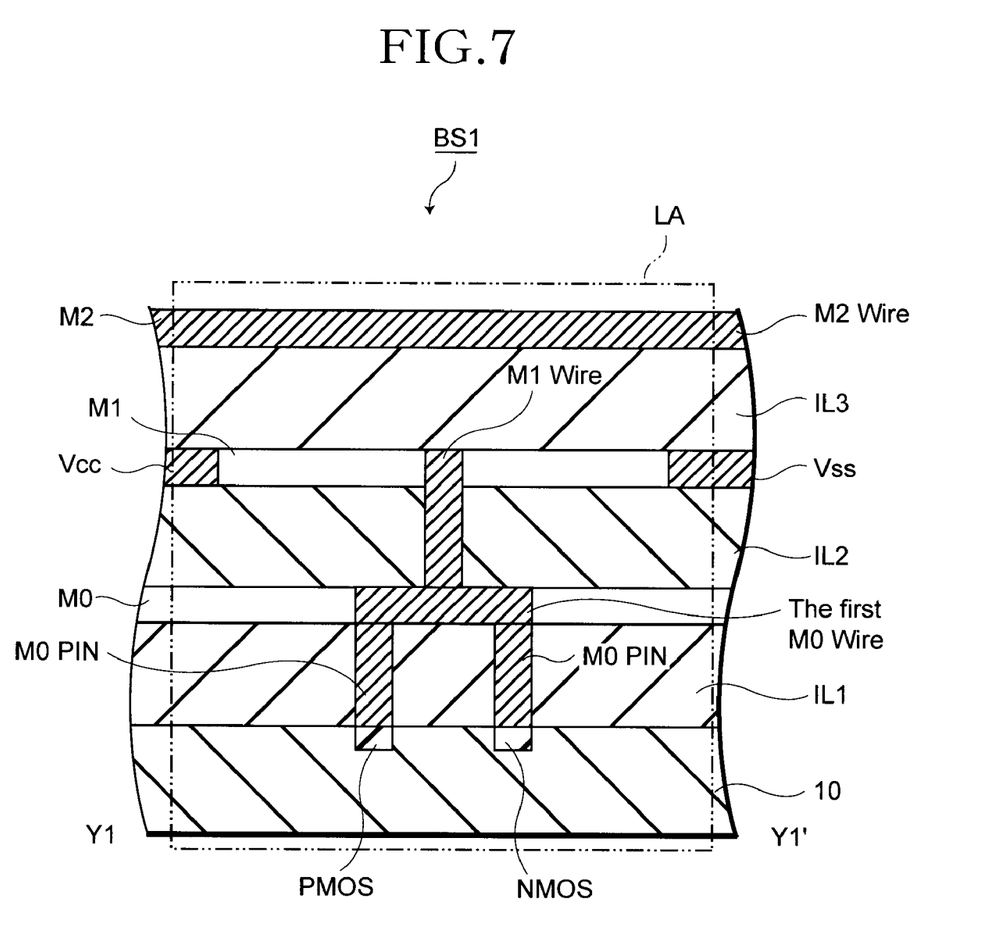
FIG. 7 is a cross-sectional view of the basic cell along the line Y1-Y1' shown in FIG. 5.

FIG. 5 is a pattern diagram which shows an arrangement of transistors and wires in a basic cell using an inverter cell BS1 which functions as an inverter as an example of a basic cell. FIG. 6 is a pattern diagram which shows an arrangement of transistors and wires in a macro cell using a macro cell MS1 which is formed by combining two inverter cells BS1 as an example of a macro cell. FIG. 7 is cross sectional view along the line Y1-Y1' in FIG. 5 and FIG. 8 is a cross sectional view along the line Y2-Y2' in FIG. 6.

Figure 8:
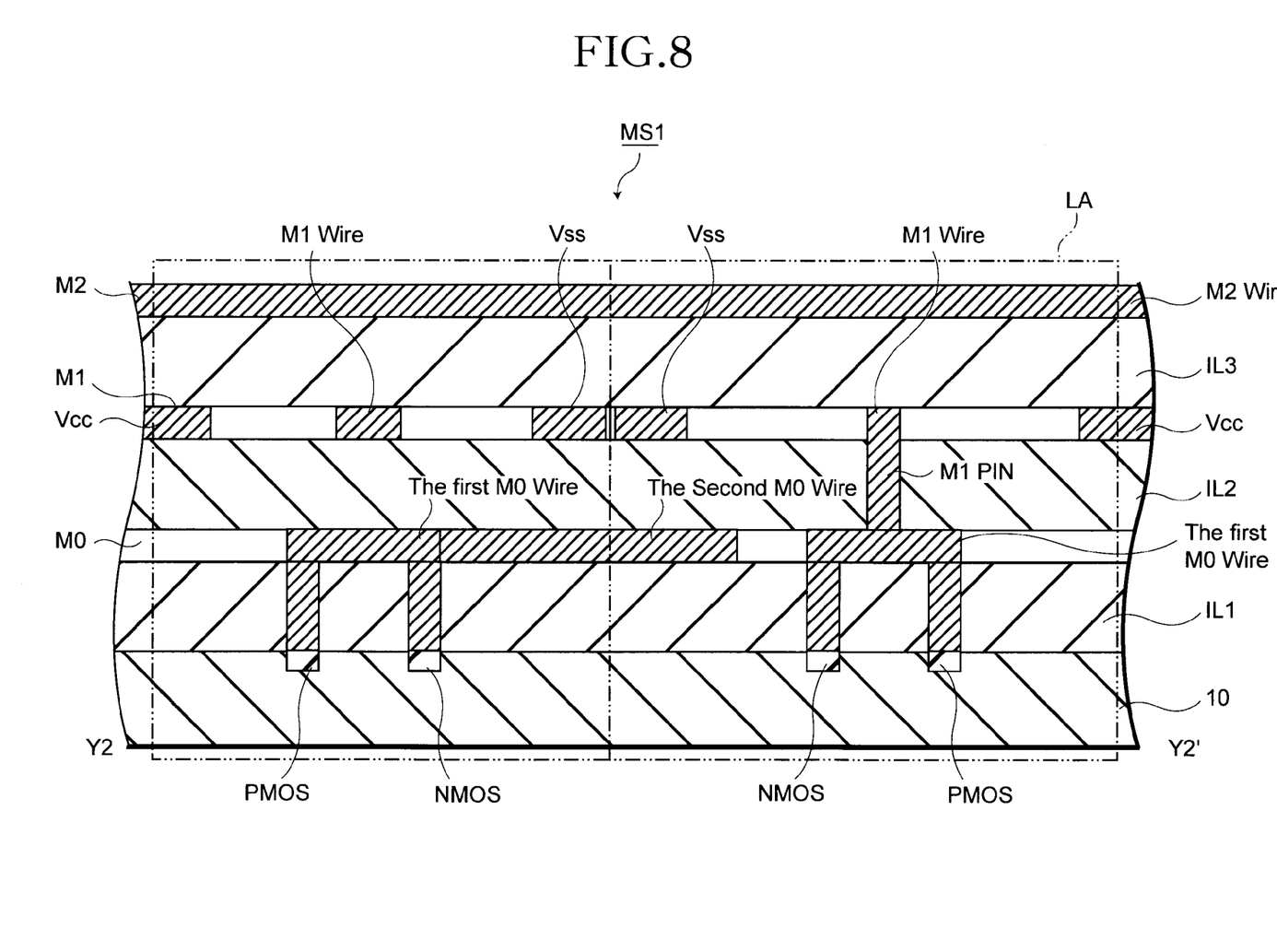
FIG. 8 is a cross-sectional view of the macro cell along the line Y2-Y2' shown in FIG. 5.

As is shown in FIG. 7 and FIG. 8, a semiconductor memory has a cross sectional construction which is stacked in this order; a semiconductor substrate 10, a first insulation layer IL1, a first wiring (M0) layer, a second insulation layer IL2, a second wiring (M1) layer, a third insulation layer IL3 and a third wiring (M2) layer. A plurality of transistors, (specifically, NMOS and PMOS), are formed as electronic elements on the semiconductor substrate 10. By connecting these transistors by the wires of each wiring layer, a function area which realizes a certain specific logic function is formed.

Further, because the NMOS transistor, PMOS transistor and the wires of each wiring layer are formed on a certain layer of a different thickness, these transistors and wires do not appear on the same surface. However, in the drawings, in order to easily understand sometimes these transistors and wires are appropriately represented on the same surface. For example, while the wires of the M1 and the wires of the M2 layer are cited in FIG. 3, the wires which are formed in the M0 layer are omitted. Also, as a matter of convenience, a line is drawn on a border between a M0 pin and a first M0 wire and a border between the wires of wiring layers of both those and a M1 pin and a border between a first M0 wire and a M0 second wire, however, these borders are not necessarily accurate and these may be successive.

One NMOS transistor and one PMOS transistor are included in the inverter cell BS1. The NMOS and PMOS are connected via a first M0 wire which is formed in the M0 layer so that they function as an inverter and a function area LA is formed. According to the present embodiment, the function area LA takes up the whole of the inverter cell BS1 and forms the same rectangular shape as the inverter cell BS1 viewed from above.

The first M0 wire which connects the NMOS and the PMOS is connected to a wire on an upper layer such as M2 via a via hole. By this, a signal which is output from a circuit within the function area LA is transferred to a signal transfer wire which is formed in a layer such as M2 via the first M0 wire.

Within the function area LA, power supplying wires (below, abbreviated to "power wire") Vcc and Vss which supply power to each of the NMOS and PMOS are arranged. The power wires Vcc and Vss extend along a pair of periphery lines which face each other in the rectangular shaped function area LA and in this example are placed on the M1 . The extended direction of the power wires Vcc and Vss become almost at a right angle to the connection direction (extended direction of the M0 wire) connecting the NMOS and PMOS via the M0 wire. Below, the direction in which the M0 wire extends is called a Y direction and the parallel direction to the power wires Vcc and Vss which is a direction perpendicular to the Y direction is called an X direction.

Several kinds of basic cell BS1 to BSn are included in the digital unit 103D which is arranged as a peripheral circuit. The shape and construction of each function area of different kinds of basic cell BS1 to BSn may be different, however, the length (below referred to as "height") of an area which is parallel to the Y direction of several kinds of basic cells BS1 to BSn are all given to be the same H. Also, the power wires Vcc and Vss, as stated above, are placed so that they extend along the periphery in parallel to the X direction of a basic cell. As a result, by placing several kinds of basic cells BS1 to BSn so that they become lined parallel to the X direction, the wires formed in M1 becomes extended linearly between several basic cells BS1 to BSn which are adjacent in the X direction (see FIGS. 4A and 4B).

Similarly, the heights (lengths of the area which is parallel to the Y direction) of several kinds of macro cell are all given to be an integral multiplication of the height H of the basic cell, for example, twice, three times, or four times and the like. As a result, the several kinds of basic cells and macro cells are mixed and placed and if the wires formed in M1 are extended parallel to the X direction, the wires formed in M1 are extended in a straight line parallel to the X direction between the different kinds of cells. As a result, even if the different kinds of cells are mixed and placed, the cells can be connected easily by wires which extend parallel to the X direction.

Alternatively, the length (width) of the area which is parallel to the X direction of the basic cell and the macro cell may be different for each kind of cell. Two macro cells MS1 and MS2 are shown in FIG. 4B and the height of the first macro cell MS1 is 2H and the height of the second macro cell MS2 is 3H. In this way, while the height of the macro cell is an integral multiplication of the height H of a basic cell, the width W1 to Wn of the basic cells BS1 to BSn and the widths MW1 and MW2 of the macro cells MS1 and MS2 are optional.

Next, a wire within a basic cell and a macro cell will be explained. Transistors, a first M0 wire which connects the transistors and power wires which supply a power voltage to the transistors are included within a basic cell. In the present embodiment, as is shown in FIG. 5, the power wires Vcc and Vss are positioned in the vicinity of the periphery of a function area LA and an NMOS transistor and a PMOS transistor are arranged on the inner side of the function area LA. Because the first M0 wire which is formed in the M0 layer connects the NMOS transistor and PMOS transistor which are arranged on the inner side of the function area LA, it is also positioned on the inner side between the power wires Vcc and Vss.

The wire of the M0 layer is generally limited to connecting transistors within the same function area, however, in the present invention, a wire of the M layer is also used for connecting different function areas within the same macro cell. As a result, in addition to the first M0 wire which connects transistors within the same function area, a second M0 wire which interchanges with a power wire and extends to the inside of a different function area within the same macro cell, is formed in the M0 layer.

Specifically, according to the present embodiment, as is shown in FIG. 6, two function areas LA1 and LA1' are included in a first macro cell MS1. A pair of power supply wires, one is a high resistance supply wire Vcc and one is a low resistance power wire Vss, are arranged along the periphery part parallel to the X direction in each function area LA1 and LA1'. The first function area LA1 and the second function area LA1' are placed so that their low resistance power wires Vss are lined in parallel side by side within the first macro cell MS1. Within the first function area LA1 and the second function area LA1', the first M0 wire is placed as an internal wire which connects the transistors NMOS and PMOS within each area.

Further, aside from this first M0 wire, a second M0 wire which connects the first function area LA1 and the second function area LA1' in the same direction as the M2 wire (that is, in a Y direction in this embodiment) is formed within the first macro cell MS1. One end of the second M0 wire is located within the first function area LA1 and the other end is located within the second function area LA1'. That is, the second M0 wire interchanges with the power wires Vss which are placed on the periphery part of both the first function area LA1 and the second function area LA1'. In the present specification, interchange is given to mean a wire intersects with another wire formed on a vertically different position so that the wires do not intersect on the same surface. Specifically, one wire (for example, the second M0 wire) sits across or passes under the other wire (for example, the power wire). According to the present embodiment, the power wires Vcc and Vss are placed on the M1 layer and the second M0 wire extends from the inner side to the outer side of one function area LA1 and passes under power wires to reach the other function area LA1'.

In this way, according to the present invention, within the same macro cell, by placing a second M0 wire which extends from one function area to another function area on the layer M0 it is possible to avoid a congestion of wires on the M2 layer and increase the placing area of the memory cell area. Below, this is stated in further detail by comparison with an example in which a second M0 wire is not placed.

Generally, the M0 wire of the M0 wiring layer which is the nearest to the semiconductor substrate is used only as a wire which connects the transistors within the same one function area and does not extend outside that one function area. In other words, usually, the M0 wire which is within the same one function area is not used in the connection of wires among basic cells, that is, among different function areas. As a result, generally, an M1 wire or an M2 wire which are wires of a wiring layer above the M0 layer is used to connect different cells.

Meanwhile, in the present invention, a macro cell has a larger scale than a basic cell and is an area which has been designed so that a complex, specific function is realized and is formed by combining a plurality of basic cells. In this way, an area corresponding to a plurality of basic cells (that is, function area) is included in a macro cell. However, generally, the wires of a wiring layer above the M0 layer is used for connecting the function areas even within a macro cell.

Here, wires within the same wiring layer are placed so that they do not intersect within the same wiring layer and mutually extend in the same direction. Alternatively, two kinds of wire (M1 wire and M2 wire) which are formed in two wiring layers (M1 and M2 layer) adjacent in the thickness direction of a semiconductor integrated circuit are placed so that they intersect each other. For example, as is shown in FIG. 3 and FIG. 4, the wires M1 and M2 which are formed in the layers M1 and M2 intersect each other. Specifically, according to the present embodiment, the M1 wire extends in the X direction substantial parallel to a short side of the peripheral circuit area and the M2 wire extends in the Y direction substantial parallel to a long side of the peripheral circuit area.

The area in which a peripheral circuit is arranged is narrow and lone as stated above, and the M2 wire extends narrow and long in the Y direction in the peripheral circuit area as shown in FIG. 3. As a result, by enlarging the placement area of the memory cell array, as the width of the peripheral circuit area becomes narrower, the width of the possible area of the wire of the M2 layer also becomes narrower. Consequently, as for the case where M0 wires of the M0 layer are used only for connecting transistors within the same one functional area, when trying to increase the size of the setting area of a memory cell array a problem of the congestion of wires of the M2 layer arises.

In the present invention, because a plurality function areas which are included within the same one macro cell are connected by the wires of the M0 layer, the congestion of wires of the M2 layer is relieved and it is possible to expand the setting area of a memory cell array and ensure high integration. Here, the M0 wire of the M0 layer M0(the second M0 wire) is not used as a bus wire and if it is limited to being used to connect a plurality of function areas which are included in the same macro cell, then it is enough when timing is guaranteed only within the same macro cell.

In order to connect the different function areas within a cell by the second M0 wire of the M0 layer and prevent delay, it is preferable that scale of the macro cell not be made too large. As a result, it is preferable to make the number of function areas formed within one macro cell below an equivalent of five basic cells, particularly, a number equivalent to 2 or 3 cells. Also, it is preferable that the number of times the second M0 wire interchanges with a power wire within the same macro cell be below three times and in particular once.

Figure 9:
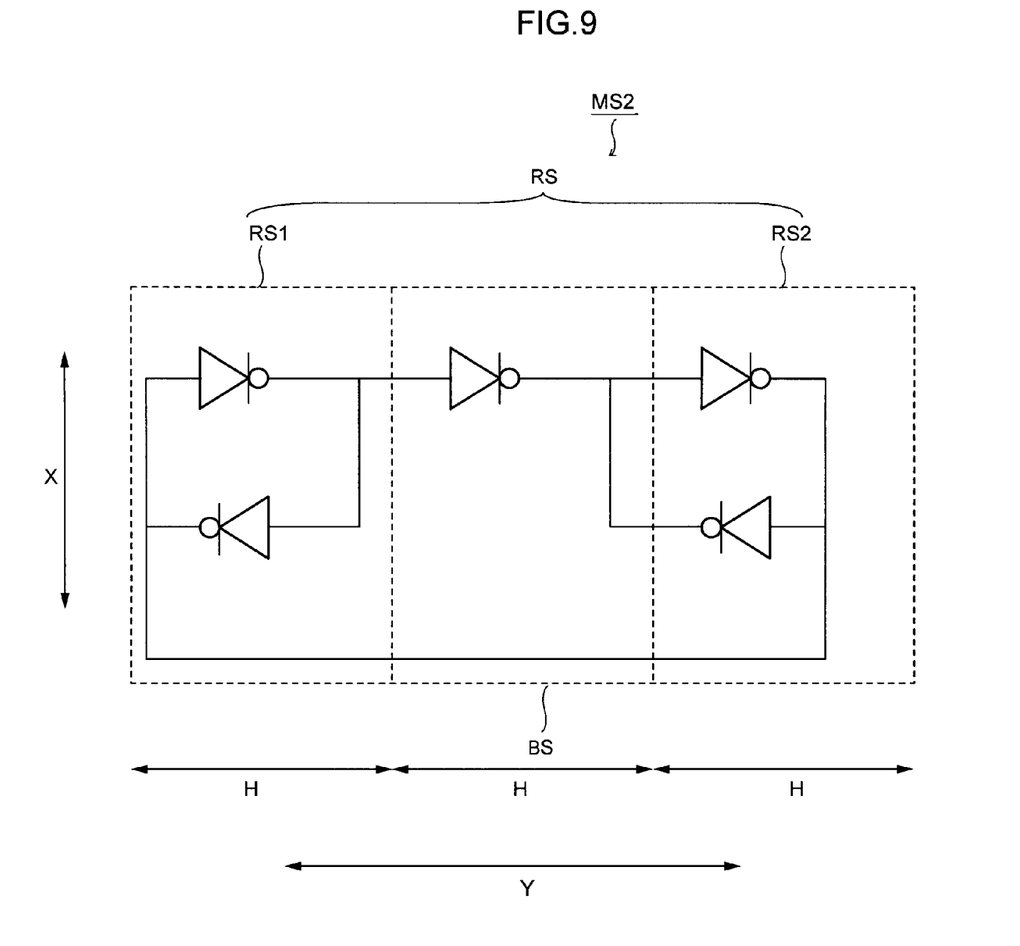
FIG. 9 is a circuit diagram of another macro cell.

As long as a macro cell has a height which is an integral multiplication of a predetermined height of a basic cell, and a wire of the M0 layer may in principle be used to connect areas (function areas) corresponding to a plurality of basic cells within the macro cell, the shape and placement of transistors are not particularly limited. As an example other than the macro cell MS1 as stated above, a circuit drawing of a macro cell MS2 which has a function area equivalent to three basic cells is shown in FIG. 9. This macro cell MS2 is formed by the combination of two kinds basic cell of latch cells RS and an inverter cell BS.

Two areas, one of which is an area of the latch cell RS1 and the other of which is an area of the latch cell RS2 are substantially same shape. And according to this embodiment, the length (height) of the areas in a Y direction is the same as the height H of the inverter cell BS. Also, the length (height) of the area of the macro cell M2 itself in a Y direction is an integral multiplication of that of the latch cell RS which is a basic cell, for example, three times 3H. As long as the height of the macro cell MS2 itself is an integral multiplication of that of a basic cell, the size of an area corresponding to a basic cell within the macro cell MS2 can be optional.

The macro cell MS2 has a construction in which one inverter cell BS is placed between two latch cells RS1 and RS2 and function as a flip flop. A first latch cell RS1 and a second latch cell RS2 are both connected to the inverter cell BS via M0 wires. The M0 wires which connect the inverter cell BS and the two latch cells RS1 and RS2 pass under the power supplying wires of the inverter cell BS and the latch cells RS. The power supplying wires are wires which supply power to transistors which are formed within each basic cell and are placed on a wiring layer (that is, the M1 layer or the M2 layer) above the M0 layer. In the macro cell MS2, because the wires which connect the basic cells (that is, the wire which connects the latch cell RS1 and the inverter cell BS and the wire which connects the latch cell RS2 and the inverter cell BS) are formed in the M0 layer, it passes under the wires used for power supply.

Figure 10:
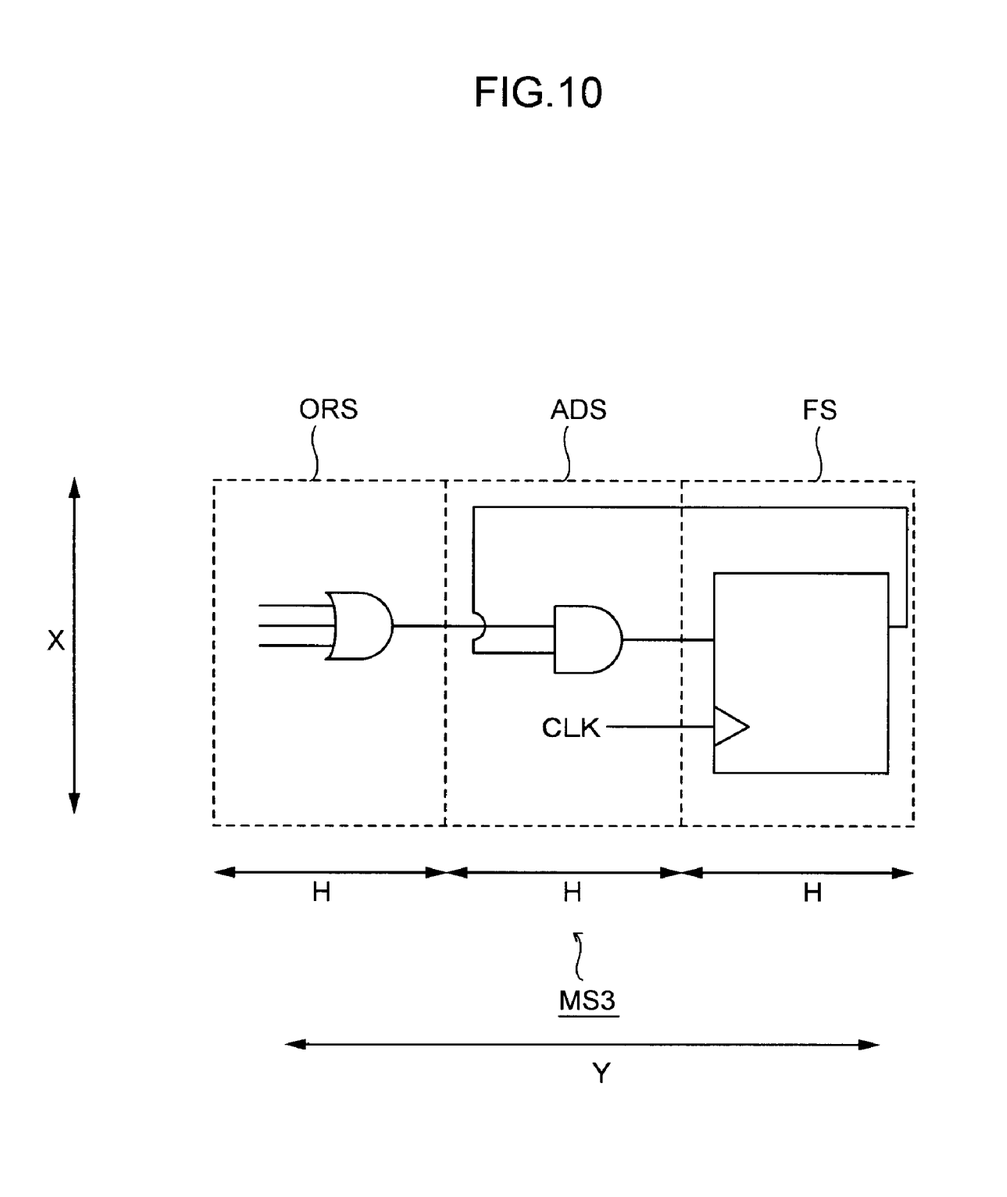
FIG. 10 is a circuit diagram of further another macro cell.

FIG. 10 shows a circuit drawing of a further different macro cell MS3. This macro cell MS3 has a function area equivalent to three basic cells, the same as the macro cell MS2. The macro cell MS3 is formed by combining three kinds of basic cell, specifically, an OR gate cell ORS, an AND gate cell ADS and a flip flop cell FS.

The length (height) of the OR gate ORS, the AND gate ADS and the flip flop gate FS in a Y direction are all the same (in the present example H) according to the present example. However, the size of the area equivalent to the basic cell within the macro cell MS3 may be optional. The length (height) of the area of the macro cell MS3 itself in a Y direction is set as an integral multiplication of a basic cell, for example, 3 times 3H.

In this example, the macro cell MS3 is formed by connecting in series the OR gate cell ORS, the AND gate cell ADS and the flip flop cell FS in this order and a clock is arranged in the flip flop cell FS. This kind of macro cell MS3 performs a set/reset operation by the input of three kinds of signal (for example, set/reset signal) to, for example, the OR gate cell ORS.

In the macro cell MS3, the basic cells within this cell are connected in principle by the M0 wires. That is, the OR gate cell ORS and the AND gate cell ADS are connected by a wire of the M0 layer. The OR gate cell and the AND gate cell ADS each include transistors and wires for power supply which supplies power to these transistors and the wire of the M0 layer passes under these power supplying wires and extends to the OR gate cell ORS or the AND gate cell ADS.

Figure 11:
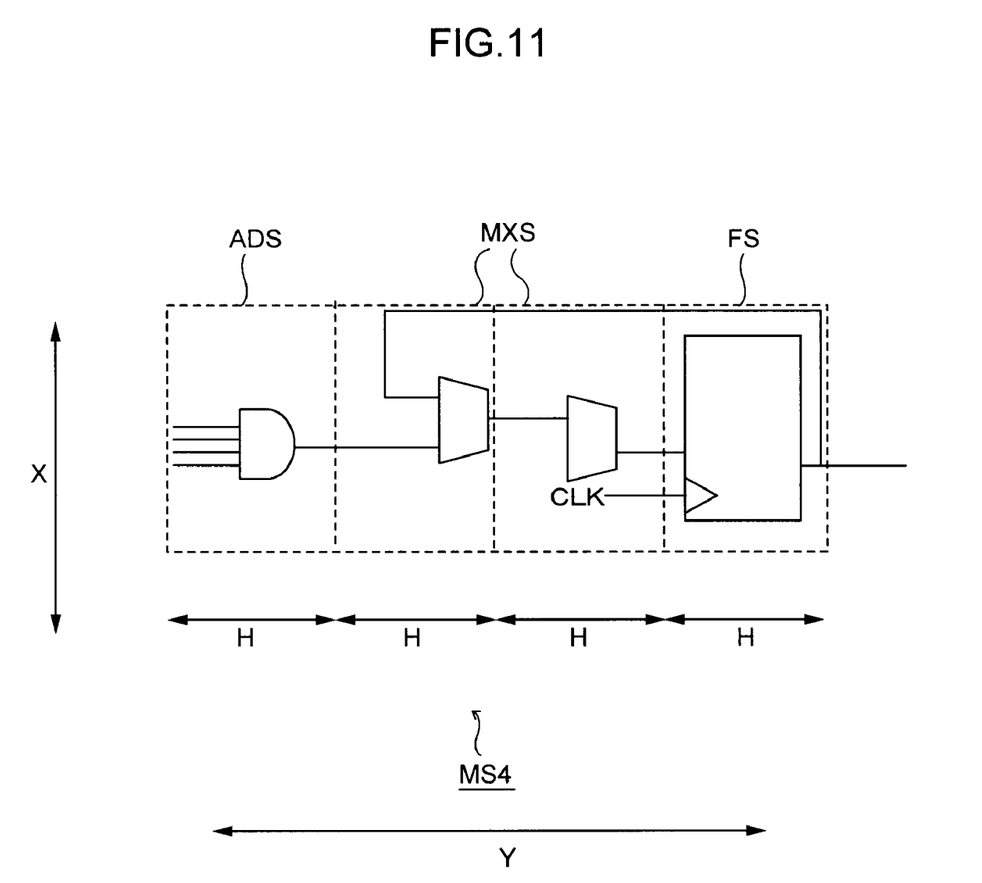
FIG. 11 is a circuit diagram of further another macro cell.

FIG. 11 shows a circuit drawing of yet another macro cell MS4. This macro cell MS4 has a function area equivalent to four basic cells. The macro cell MS4 is formed by combining three kinds of basic cell, specifically, an AND gate cell ADS, multiplexer cells MXS and a flip flop cell FS.

The multiplexer cell MXS and another basic cell (AND gate cell ADS, flip flop cell FS) are both the same length (height) in a Y direction (in the present example H). The length (height) of the macro cell MS4 itself in a Y direction is set as an integral multiplication of a basic cell, for example, 4 times 4H. Further, the size of the area equivalent to a basic cell within the macro cell MS4 is not limited, for example, the height may be 3 times 3H of the basic cell by working on the shape of the area equivalent to a basic cell.

In this example, an AND gate cell ADS, two multiplexer cells MXS and a flip flop cell FS are connected in series in this order in the macro cell MS4 and a clock is arranged in the flip flop cell FS. This kind of macro cell MS4 functions as an address decoder which selects an address by an input of four kinds of signal (for example, an address signal) to, for example, the AND gate cell ADS.

In the macro cell MS4 too, the basic cells within that cell are in principle connected by the M0 wire. That is, the AND gate cell ADS and the multiplexer cell MXS are connected with a wire of the M0 layer, the two multiplexer cells MXS are connected with a wire of the M0 layer, and also the multiplexer cell MXS and the flip flop cell FS are connected by a wire of the M0 layer. Transistors and wires for power supply which supply power to these transistors are included within each of these basic cells and the wire of the M0 layer which connects these basic cells passes under these power supplying wires and extends to another cell to be connected.

Next, a circuit design performed by a standard cell method to manufacture the semiconductor integrated circuit stated above will be explained. The manufacturing process of the semiconductor integrated circuit will be explained mainly by the design process and the manufacture process. Firstly, in the design process, a plurality of basic cells are prepared as a cell design process. Each of the basic cells has one specified function area, and each area is designed to realize one basic circuit. Similarly, a plurality of cells are prepared as various macro cells. Each of the macro cells realizes not so large scale logical function, for example the function is realized by combining a few basic cells. The plurality of basic cells and macro cells are each designed and verified in advance and cell data regarding at least the basic cells is registered in a cell library.

Particularly when a memory device is designed, it is preferred that areas for realizing logical functions which are repeatedly, for example, about 3 to 80 times, used in a peripheral circuit area are made into macro cells. Specifically, as stated above, an area to which set parameters and reset parameters are input and which performs a decode logic by decoding address to realize set and reset operation can be made a macro cell.

In the present specification, "the basic cell" and "the macro cell" are terms used in order to classify a plurality of areas each of which realizes a certain specific logic function mainly by the length (height) in the Y direction. Therefore, the macro cell is not limited to that stated above. That is, in the present specification, a cell which realizes a certain specific logic function and has a height which becomes the standard for the height of a macro cell is called a basic cell. A cell which is larger than a basic cell and has a height which is an integral multiplication of that of a basic cell is called a macro cell. As a result, a cell which appears frequently (for example, over 100 times) in the peripheral circuit area may be registered in the library as a basic cell, even if it is configured by combing a few basic cells such as AND gate to realize a specific logical function.

In addition, in the example stated above, the macro cell is configured by aligning a few blocks, where one block corresponds to one basic cell. However, the size of an area which is equivalent to one basic cell within the macro cell may be optional. That is, when a latch cell and a flip flop cell both having a height H are prepared as a basic cell and a macro cell is configured by combining the latch cell and the flip flop cell, the height of areas corresponding to the latch cell and the flip flop cell may not be different from the height H within the macro cell.

The basic cell and macro cell are designed so that they have the above stated construction, in particular, several kinds of basic cell are all designed so that they have the same height. Also, a plurality of macro cells are designed so that they include function areas equivalent to a plurality of basic cells, specifically, about 2 to 3 basic cells and the height of the macro cells are all an integral multiplication of the height of the basic cell. Also, the connection of the function areas within a macro cell is designed in advance so that the function areas are connected by a M0 wire of the M0 layer.

In addition, a wire of the M0 layer is used to connect areas (function areas) which are equivalent to a basic cell within one macro cell as a principle, though a wire of another wiring layer than the M0 layer may be also used for that connection. Likewise, a wire of the M0 layer is primarily used to connect transistors within one function area (basic cell), though a wire of upper wiring layer than the M0 layer may be secondarily used for avoiding crossing of wires in order to form an area with a specific logic function. In this way, by using the M0 wire, in principle, for connecting function areas which perform different logic functions within the same macro cell, it is possible to avoid congestion of wires in a higher wiring layer, in particular, wires of the M2 layer which run in the same direction as that of the M0 layer.

Next, as a cell placement design process a cell which is registered in the cell library is selected and at least a basic cell and a macro cell are placed in the peripheral circuit area. Here, in the present invention, the height H of several kinds of basic cell are all the same and the height of several kinds of macro cell are an integral multiplication of the height of a basic cell and preferably 2H or 3H. As a result, when placing a cell, there is no need for adjustment in order to align both periphery's (upper side and lower side) of the height direction of each kind of cell and the basic cell and macro cell can be easily placed in a mixed state. Therefore, even if it is a semiconductor used for a specific purpose it is possible to reduce development time.

Continuing with the cell placement design process, a wire of a wiring layer above the M0 layer is used to connect cells as a design process of cell placement. According to the standard cell method, the wire distribution between the basic cells can be performed by auto routing which automatically extracts terminal data and wire data of a cell based on the data registered in the cell library. The wire distribution between macro cells or between a basic cell and a macro cell can be made automatically if the data of a macro cell is registered in the cell library. It is also possible to reduce the time required for the development of a semiconductor integrated circuit if auto routing is used.

Figure 12:
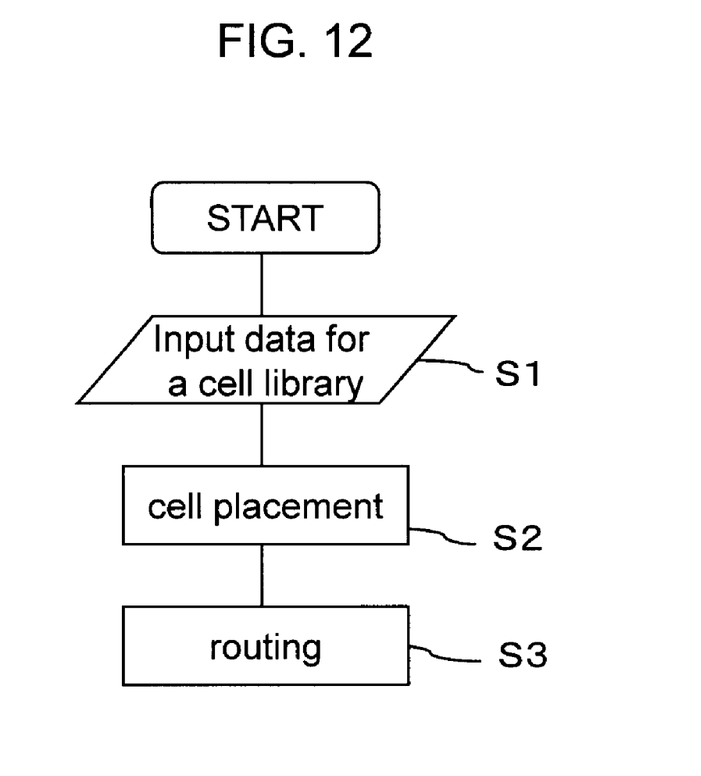
FIG. 12 is a flow chart of a program for designing a semiconductor integrated circuit of the present invention.
Figure 13:
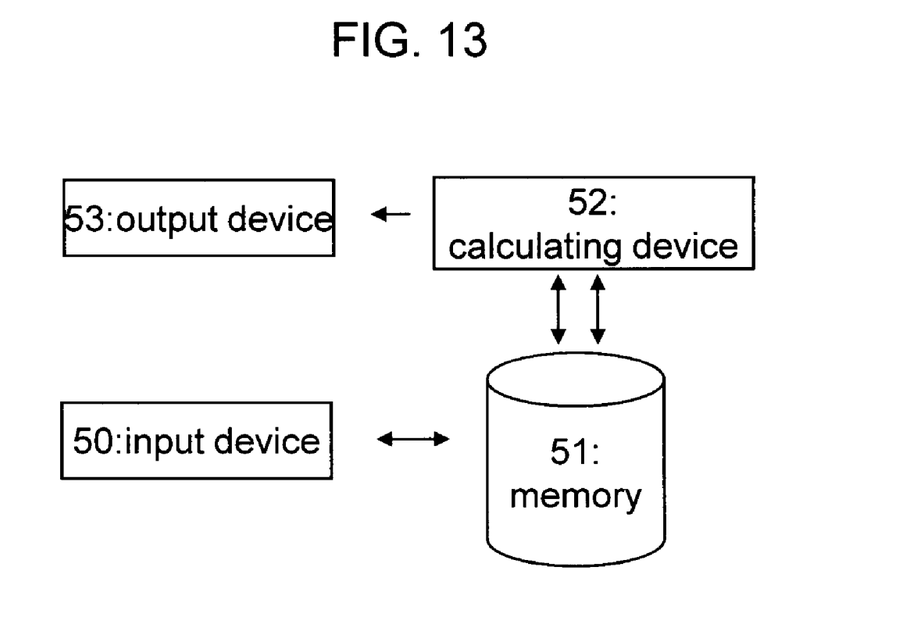
FIG. 13 is a block diagram showing a framework of a computer used for designing a semiconductor integrated circuit of the present invention.

The above stated semiconductor integrated circuit is designed with a computer which is installed with a software. The software realizes program which operates by a flow shown in FIG. 12. FIG. 13 is a block diagram which shows the construction of a computer which is installed with this software and which is used in the circuit design of a semiconductor integrated circuit.

First, transistor placement and wire distribution of a basic cell and a macro cell are designed and the data of each cell for the cell library are obtained. Then, in step S1, the cell library data of a basic cell and a macro cell are input via an input device 50 such as a keyboard. The cell library data input in this step S1 are stored in a memory 51 such as a ROM.

Next, a calculating device 52 such as a CPU is used and the cell library data which is stored in the memory 51 is read, a calculation process is performed which designs a placement of cells and cells are placed (step S2). In step 2, after the placement of cells, a calculating device 52 is used to perform a calculation for wiring between cells (step S3). The cell placement and the wire distribution are designed at that steps, and a semiconductor integrated circuit of a memory is designed.

In this way, after designing wire distribution by cells in the design process, transistors are formed on a silicon wafer semiconductor substrate in a manufacturing process and then a first insulation layer IL1, a first wiring (M0) layer, a second insulation layer IL2, a second wiring (M1) layer, a third insulation layer IL3 and a third wiring (M2) layer are formed in order and a semiconductor integrated circuit is manufactured.

The material used for a semiconductor substrate is not limited, for example, it is possible to use a P type silicon substrate which has added impurities such as phosphorus to a single crystal silicon. The first to third insulation layer IL1 can be formed by silicon oxide film. The M0 layer can be formed by tungsten, polysilicon or copper. The M1 layer and the M2 layer can be formed by copper or gold.

What is claimed:

1. A semiconductor integrated circuit comprising:
a semiconductor substrate formed with a plurality of transistors;
a first wiring layer formed on said semiconductor substrate;
a second wiring layer formed on said first wiring layer;
a third wiring layer formed on said second wiring layer;
first M0 wires formed in said first wiring layer for connecting a number of said plurality of transistors to have a specific logic function;
a power supplying wire formed in a different wiring layer to said first wiring layer for supplying power to said transistors;
a plurality of function areas in which at least one of said first M0 wire, said power supplying wire, and a number of said plurality of transistors connected via said first M0 wire as an internal wire are arranged;
a second M0 wire formed in said first wiring layer for connecting a plurality of said function areas;
a basic cell having a predetermined height and one of a plurality of said function areas; and, a macro cell including a plurality of function areas which are connected by said second M0 wire, the height of said macro cell being an integral multiplication of the height of said basic cell.

2. The semiconductor integrated circuit according to claim 1, wherein the internal wire of said basic cell includes said first M0 wire which is placed within said function area, the internal wire of said macro cell includes first M0 wires arranged in each of said plurality of function areas and said second M0 wire which connects said plurality of function areas, and said second M0 wire is limited for connecting a plurality of function areas within the same macro cell.

3. The semiconductor integrated circuit according to claim 1, further comprising:

an M1 wire formed in said second wiring layer and connecting said basic cell and said macro cell in a direction parallel to a width direction, and an M2 wire formed in said third wiring layer and connecting said basic cell and said macro cell in a direction parallel to said height direction.

4. The semiconductor integrated circuit according to claim 3, wherein said power supplying wire is formed parallel to said M1 wire in said second wiring layer, and said second M0 wire passes under said power supplying wire and connects function areas which are included in said macro cell in a parallel direction to said height direction.

5. The semiconductor integrated circuit according to claim 1, wherein the whole of said basic cell is made into said functional area, and the heights of a plurality of functional areas of said macro cell are the same length as the height of said basic cell.

6. The semiconductor integrated circuit according to claim 5, wherein said macro cell includes 2 or 3 function areas.

7. The semiconductor integrated circuit according to claim 4, wherein the whole of said basic cell is made into said functional area, the heights of a plurality of function areas of said macro cell are the same height as the height of said basic cell, said power supplying wire is formed in said second wiring layer so that it extends along a periphery parallel to said width direction in said function area, power supplying wires of a pair of function areas which are adjacent in said height direction in said macro cell are adjacent to each other, and said second M0 wire passes under said power supplying wires and connects said pair of function areas in a direction parallel to said height direction.

8. The semiconductor integrated circuit according to claim 1, wherein said second wiring layer and said third wiring layer are metal layers, and said first wiring layer has a higher resistance than said second wiring layer and said third wiring layer.

9. A semiconductor integrated circuit design method comprising:

connecting a plurality of transistors which are formed in a semiconductor substrate using an M0 wire which is formed in a first wiring layer formed on said semiconductor substrate to form a basic cell having a specific logic function and a predetermined height;

registering the cell data of said basic cell in a cell library;

preparing a macro cell having the height of an integral multiplication of the height of said basic cell and a logic circuit larger than that of said basic cell;

connecting said transistors with said macro cell using an M0 wire formed in said first wiring layer;

wiring between said basic cell and said macro cell using said cell library in a state where said basic cell and said macro cell are congested, under a rule where said basic cell and said macro cell are connected by an M1 wire which is formed in a second wiring layer formed on said first wiring layer and an M2 wire which is formed in a third wiring layer formed on said second layer.

10. The semiconductor integrated circuit design method according to claim 9, wherein said basic cell has one area in which a plurality of said transistors, a first M0 wire which connects said transistors, and a power supplying wire for supplying power to said transistors formed in a different wiring layer to said first wiring layer are arranged, said macro cell having a plurality of said areas, and transistors within the same area are designed to be connected using a first M0 wire and transistors within a different area are connected using a second M0 wire in said macro cell.

11. The semiconductor integrated circuit design method according to claim 10, wherein said power supplying wire is formed in a different wiring layer to said first wiring layer in parallel to said width direction, and said second M0 wire is set to pass under said power supplying wire to connect a plurality of areas of said macro cell in a direction parallel to said height direction within said macro cell.

12. The semiconductor integrated circuit design method according to claim 11, wherein said M1 wire is designed to connect said basic cell and said macro cell in a direction parallel to said width direction, and said M2 wire is designed to connect said basic cell and said macro cell in a direction parallel to said height direction.

13. The semiconductor integrated circuit design method according to claim 9, wherein said second wiring layer and said third wiring layer are metal layers, and said first wiring layer has a higher resistance than that of said second wiring layer and said third wiring layer.

* * * * *